United States Patent
Kozko

(10) Patent No.: US 9,576,394 B1
(45) Date of Patent: Feb. 21, 2017

(54) LEVERAGING A MULTITUDE OF DYNAMIC CAMERA FOOTAGE TO ENABLE A USER POSITIONAL VIRTUAL CAMERA

(71) Applicant: Dmitry Kozko, Aventura, FL (US)

(72) Inventor: Dmitry Kozko, Aventura, FL (US)

(73) Assignee: 360 LAB LLC., Miami, FL (US)

( * ) Notice: Subject to any disclaimer, the term of this patent is extended or adjusted under 35 U.S.C. 154(b) by 122 days.

(21) Appl. No.: 14/144,675

(22) Filed: Dec. 31, 2013

Related U.S. Application Data

(60) Provisional application No. 61/853,711, filed on Apr. 10, 2013, provisional application No. 61/854,397, filed on Apr. 23, 2013.

(51) Int. Cl.
| | | |
|---|---|---|
| *G06T 15/00* | (2011.01) | |
| *G06T 17/00* | (2006.01) | |
| *G06T 15/30* | (2011.01) | |
| *G06T 15/20* | (2011.01) | |

(52) U.S. Cl.
CPC .............. *G06T 17/00* (2013.01); *G06T 15/20* (2013.01); *G06T 15/30* (2013.01)

(58) Field of Classification Search
CPC ........... G06T 15/10; G06T 15/20; G06T 17/00
USPC .. 345/419, 619, 632, 633; 348/578; 382/103
See application file for complete search history.

(56) References Cited

U.S. PATENT DOCUMENTS

| | | | | |
|---|---|---|---|---|
| 6,141,060 A | * | 10/2000 | Honey et al. | 348/578 |
| 6,384,871 B1 | * | 5/2002 | Wilf et al. | 348/578 |
| 6,669,346 B2 | * | 12/2003 | Metcalf | 353/94 |
| 8,180,107 B2 | * | 5/2012 | Broaddus et al. | 382/103 |
| 8,786,596 B2 | * | 7/2014 | House | 345/419 |

* cited by examiner

*Primary Examiner* — Phu K Nguyen
(74) *Attorney, Agent, or Firm* — Patents on Demand P.A.; Brian K. Buchheit; Scott M. Garrett

(57) ABSTRACT

A virtual camera within a volumetric model of a real world environment during an event occurring within the real world environment can be identified. The virtual camera can be associated with at least one of a location and an orientation within the real world environment. A virtual stream for the virtual camera can be constructed. The field of view of the stream can include video obtained from two cameras present within the real world environment and video not captured by a camera within the real world environment. The video field point of view can correspond to at least one of the location and orientation of the virtual camera. The virtual stream of the virtual camera can be presented within an interface of computing device responsive to the constructing.

20 Claims, 4 Drawing Sheets

LEVERAGING A MULTITUDE OF DYNAMIC CAMERA FOOTAGE TO ENABLE A USER POSITIONAL VIRTUAL CAMERA

CROSS-REFERENCE TO RELATED APPLICATIONS

This application claims priority to provisional application No. 61/853,711, entitled "System and Method for Stitching Videos Received from Multiple Unsynchronized Cameras", filed Apr. 10, 2013, as well as provisional application No. 61/854,397, entitled "360 Degrees Cameras", filed Apr. 23, 2013. Both provisional applications are hereby included in their entirety.

BACKGROUND

The present invention relates to the field of video processing and, more particularly, to leveraging a multitude of dynamic camera footage to enable a user positional virtual camera.

Auto racing (also known as automobile racing, car racing, or motor car racing) is an extremely popular sport with loyal and involved fans. Auto racing includes stock car racing, production car racing, sports car racing, formula racing, and the like, where vehicles race each other on a fixed moto racing track.

Spectators, which include live and broadcast spectators, of auto racing often desire to be immersed in the experience. The more immersive and interactive the experience, the more enthusiasm is generated for the sport. In a number of instances, spectators are willing to pay for premium access to race details. While a number of premium access mechanisms exist, these do not satisfy fans desires for an immersive and interactive experience.

For example, NASCAR™ mobile applications exist (for APPLE™ and ANDROID™ devices) which offer news, video, social, and race information. An in-app subscription to this mobile application allows users to receive enhanced live content, which includes driver audio, a 3D race virtualization, track positions, and live driver telemetry (GPS positioning information). In-car audio is also provided for some races.

NASCAR™ also offers a product called RACE BUDDY™, which includes an ability to see live camera feeds, a pit road camera, a chat, and a leaderboard. Generally speaking, the "live" cameras are time delayed, sometimes over a minute from each other. The cameras are the set of cameras that broadcasters select from for race coverage. Effectively, the above apps and other known enhancements are aggregating Web portals that group information for user viewing. None of the known mechanisms grant end users an ability to control race specifics, such as viewing details seen from race driver perspectives. Thus, existing products are effectively a set of pushed facts covered over an Internet Protocol (IP) network about a race, as opposed to an interactive and immersive experience that gives end users a level of control on how a race is to be experienced.

BRIEF SUMMARY

One aspect of the present invention can include a system, an apparatus, a computer program product, and a method for leveraging a multitude of dynamic camera footage to enable a user positional virtual camera. A virtual camera within a volumetric model of a real world environment during an event occurring within the real world environment can be identified. The virtual camera can be associated with at least one of a location and an orientation within the real world environment. A virtual stream for the virtual camera can be constructed. The field of view of the stream can include video obtained from two cameras present within the real world environment and video not captured by a camera within the real world environment. The video field point of view can correspond to at least one of the location and orientation of the virtual camera. The virtual stream of the virtual camera can be presented within an interface of computing device responsive to the constructing.

Another aspect of the present invention can include an apparatus, a computer program product, a method, and a system for leveraging a multitude of dynamic camera footage to enable a user positional virtual camera. A virtual camera engine can be configured to present a virtual video stream associated with a virtual camera. The virtual camera can be mapped to a location and/or an orientation of a volumetric model of a real world environment. The video stream can be synchronized to a timeline of an event occurring within the real world environment. A data store can be able to persist the model, the video stream, and/or the virtual camera metadata. The metadata can be a field of view, a focal length, and/or an aperture.

DETAILED DESCRIPTION

Figure 1:
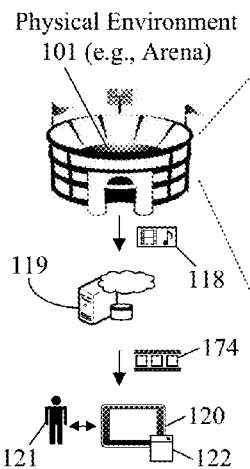
FIG. 1 is a schematic diagram illustrating a set of scenarios for leveraging a multitude of dynamic camera footage to enable a user positional virtual camera in accordance with an embodiment of the inventive arrangements disclosed herein.
Figure 1:
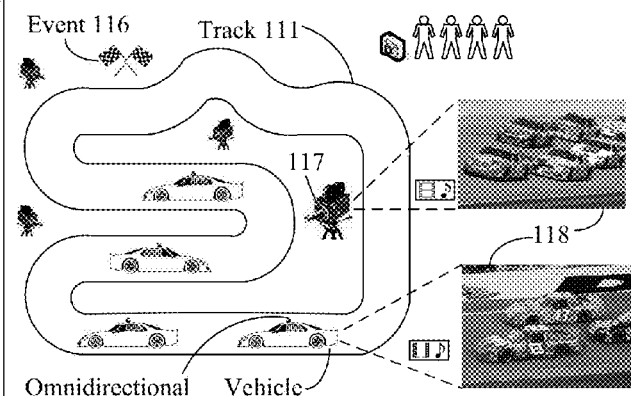
Figure 1:
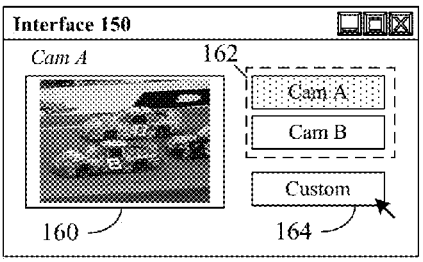
Figure 1:
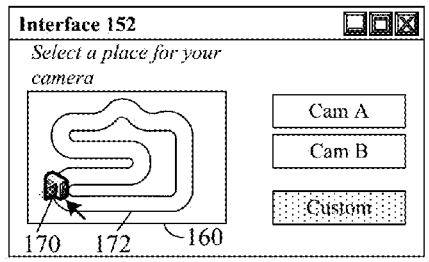
Figure 1:
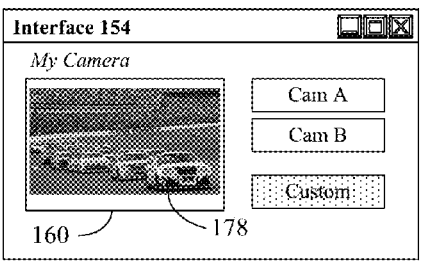

The present disclosure is a solution for leveraging a multitude of dynamic camera footage to enable a user positional virtual camera. In the solution, one or more cameras within a physical environment can capture video feeds of a real world event. The video feeds can be aggregated and analyzed to produce a volumetric model. The model can enable a virtual camera to be specified and a real-time virtual video stream for the virtual camera to be viewed. In one instance, the stream can be presented during the event upon a companion computing device. In the instance, the virtual camera can be dynamically adjusted and the corresponding video stream can be generated and presented.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is a schematic diagram illustrating a set of scenarios 110, 140 for leveraging a multitude of dynamic camera footage to enable a user positional virtual camera in accordance with an embodiment of the inventive arrangements disclosed herein. In scenario 110, a user 121 can interact with a companion device 120 to view a virtual video stream 174 of an event 116 from a virtual camera 170. In scenario 140, a user 121 can interact with a map 172 to position a virtual camera 170 which can present virtual video stream 174 within an interface 154.

In scenario 110, one or more video feeds 118 obtained from an event 116 can be leveraged to enable a custom view 178 from any location within environment 111. The location can permit a virtual camera 170 to be placed at a user 121 specified location. Feeds 118 can be captured by one or more cameras 117, 112 and can be conveyed to a broadcast system 119. When a virtual camera is specified, system 119 can convey a virtual video stream 174 to a companion device 120. When no virtual camera is specified, the system 119 can convey one or more feeds 118. Application 122 executing on device 120 can present feed 118 or stream 174 within one or more interfaces (e.g., interface 154).

Feeds 118 can be captured during event 116 for the duration of event 116. Event 116 can occur within a real world environment such as physical environment 111. For example, event 116 can be an automotive racing event taking place at a racing track arena 101. In one instance, feeds 118 can be obtained from a broadcast camera 117 and/or omnidirectional camera 112 affixed to vehicle 114. In the instance, camera 117, 112 can be a fixed and/or movable camera. For example, broadcast camera 117 can be a stationary camera which can capture video of vehicle 114 traveling around track 111. In one embodiment, additional cameras can be leveraged to produce a virtual video stream 174. In the embodiment, user operated cameras (e.g., spectator cameras) can be utilized to obtain feed 118 which can enable a virtual video stream 174.

In scenario 140, interface 150-154 can permit viewing feeds 118 and/or stream 174 via interface element selection 162, 164. Interface 150 can include a graphics pane 160 which can present one or more feeds 118. For example, when a Camera A (e.g., broadcast camera 117) is selected via interface element 162 (e.g., interface button), a video feed from Camera A (e.g., broadcast camera 117) can be presented within pane 160. In one instance, interface 150 can include an interface element 164 which can permit the specification of a virtual camera 170. In the instance, upon selection 164, interface 152 can be presented.

In interface 152, a map 172 of track 111 can be presented within graphics pane 160. Map 172 can permit a virtual camera 170 to be positioned and/or oriented based on a user 121 input. In one instance, map 172 can be a pictoral map representing track 111. In another instance, map 172 can be a global positioning system (GPS) based map allowing a virtual camera 170 to be placed via a mouse cursor within a geographical region of track 111. In one embodiment, map 172 can be a three dimensional map, two dimensional map, and the like.

In interface 154, stream 174 of virtual camera 170 can be generated from existing video feed 118 of one or more cameras 112, 117. That is, virtual video stream 174 can be dynamically generated in real-time from subsequent real-time feeds. In one instance, stream 174 can be concurrently presented within interface 154 during event 116. In another instance, stream 174 can be simultaneously presented with one or more feeds 118. It should be appreciated that camera 170 can facilitate views which can be impossible to capture using cameras 112, 117. For example, a virtual camera 174 can be placed in the middle of a racing track permitting cars to appear to travel through the camera.

Virtual camera 170 can include one or more characteristics 171 which can shape the stream 174 characteristics. Characteristics 171 can include, but is not limited to, field of view, focal length, aperture, and the like. Stream 174 characteristics can include, but is not limited to, frame rate, video quality, aspect ratio, video compression, stereoscopic channels, and the like.

Drawings presented herein are for illustrative purposes only and should not be construed to limit the invention in any regard. It should be appreciated that camera 112 can be 360 degree cameras able to capture a greater than three hundred and sixty degree view of track 111 and/or arena 101.

It should be appreciated that video feed 118 can include continuous oblique video, aerial video, and the like. In one instance, the video 118 can be continuously aligned to a three dimensional point cloud. In the instance, the point cloud can be utilized to compute two dimensional perspective video and/or three dimensional perspective video associated with a virtual camera position and/or orientation. In one embodiment, a modeling through registration approach (e.g., photogrammetric modeling and model-based stereo computation) can be utilized to fuse photometric data with video. In the embodiment, the approach can enable a real-time virtual video feed from a virtual camera can be constructed from the model.

It should be appreciated that feed 174 can include video frames of real world video and can lack computer graphics. That is, feed 174 can lack graphically rendered frames. In one embodiment, feed 174 can include interpolated frames generated from feeds 118. In one instance, a video baseline of a physical environment 101 can be utilized to interpolate frames when feeds 118 lack sufficient data.

It should be appreciated that feeds 118 from cameras 112, 117 can be subject to video processing to eliminate and/or reduce motion blur (e.g., jitter), noise, low light, and the like.

Figure 2:
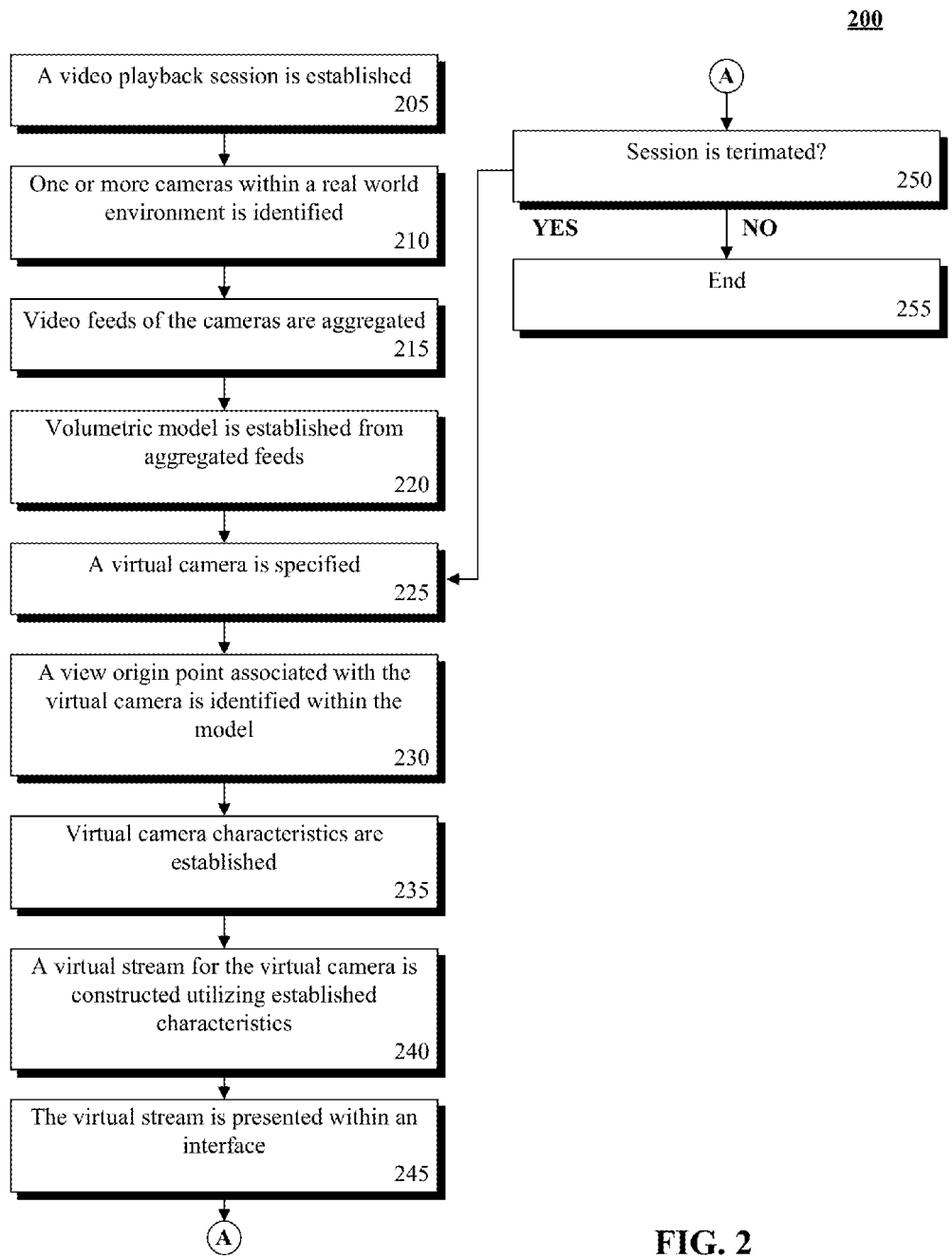
FIG. 2 is a schematic diagram illustrating a method for leveraging a multitude of dynamic camera footage to enable a user positional virtual camera in accordance with an embodiment of the inventive arrangements disclosed herein.

FIG. 2 is a schematic diagram illustrating a method 200 for leveraging a multitude of dynamic camera footage to enable a user positional virtual camera in accordance with an embodiment of the inventive arrangements disclosed herein.

In method 200, a virtual camera can be established during a video playback session. A virtual video stream associated with the virtual camera can be presented within an interface of the playback session.

In step 205, a video playback session can be established. The playback session can be manually and/or automatically established. In step 210, one or more cameras within a real world environment can be identified. The cameras can be identified via traditional and/or proprietary mechanisms. In step 215, one or more video feeds from the cameras can be aggregated. Video aggregation can be performed in real-time or near real-time. In step 220, a volumetric model can be established from the aggregated feeds. The volumetric model can include additional video feeds including, but not limited to, real-time photography, previously recorded video baselines, and the like. In step 225, a virtual camera can be specified. The virtual camera can be specified based on user preferences, historic settings, and the like. In step 230, a view origin point associated with the virtual camera can be identified within the model. The origin point can be identified utilizing traditional camera pose estimation, user input, and the like. In step 235, the virtual camera characteristics can be established. Characteristics can be manually and/or automatically established. In step 240, a virtual stream for the virtual camera can be constructed utilizing established characteristics. In step 245, the virtual stream can be presented within an interface. In one embodiment, the virtual stream can be associated with an authorization mechanism permitting the virtual stream to be conveyed to authorized devices. In step 250, if the session is terminated, the method can continue to step 255, else return to step 225. In step 255, the method can end.

Drawings presented herein are for illustrative purposes only and should not be construed to limit the invention in any regard. It should be appreciated that method 200 can be performed in real-time or near real-time. Further, method 200 can be performed in serial and/or in parallel. Steps 225-250 can be performed for each virtual specified during the session.

Figure 3:
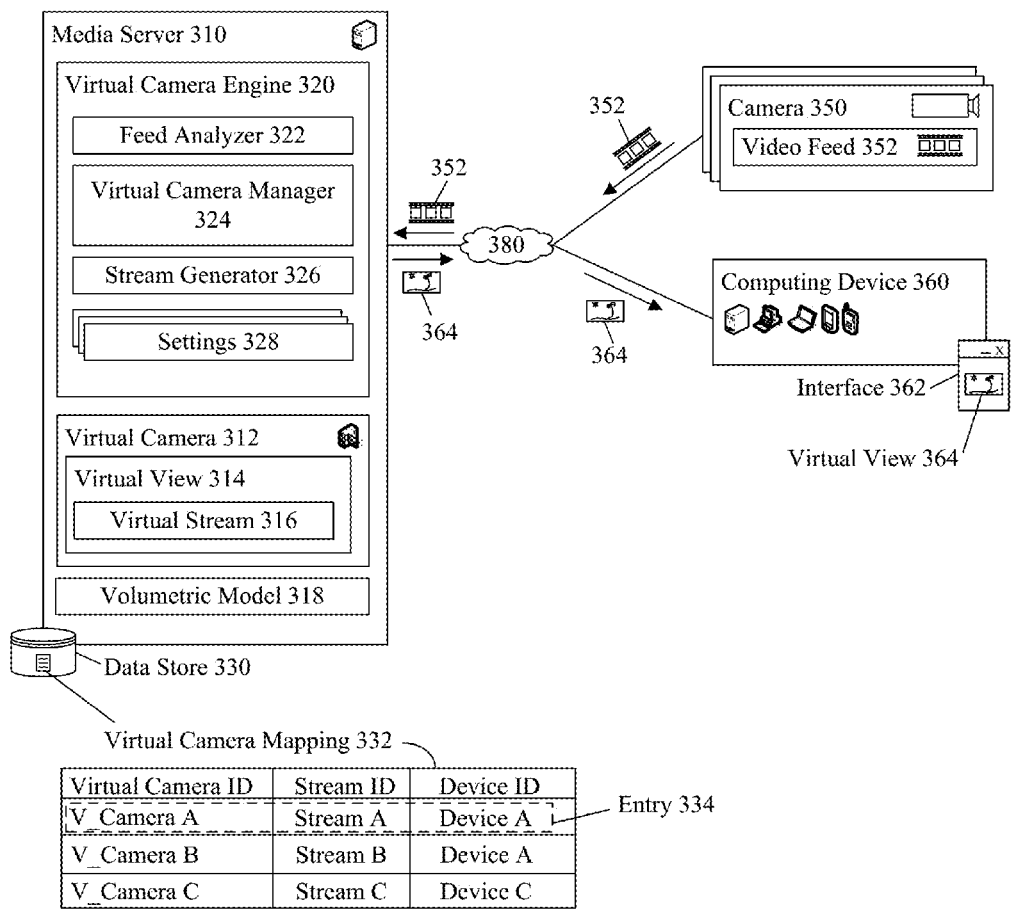
FIG. 3 is a schematic diagram illustrating a system for leveraging a multitude of dynamic camera footage to enable a user positional virtual camera in accordance with an embodiment of the inventive arrangements disclosed herein.

FIG. 3 is a schematic diagram illustrating a system 300 for leveraging a multitude of dynamic camera footage to enable a user positional virtual camera in accordance with an embodiment of the inventive arrangements disclosed herein. In system 300, a virtual camera engine 320 can utilize a volumetric model 318 to enable a virtual view 314 of an event. The event can be recorded by one or more cameras 352 which can provide video feed 352 which can be processed to provide a virtual view 314.

Media server 310 can be a hardware/software entity for executing virtual camera engine 320. Server 310 functionality can include, but is not limited to, camera 350 registration, device 360 registration, communication management, file sharing, encryption, and the like. Server 310 include, but is not limited to, virtual camera engine 320, virtual camera 312, volumetric model 318, data store 330, and the like. In one embodiment, server 310 can be a component of a television broadcasting system.

Virtual camera engine 320 can be a hardware/software element for leveraging video feed 352 into a virtual stream 316 associated with a virtual camera 312. Engine 320 functionality can include, but is not limited to, volumetric model 318 creation, synchronization (e.g., to event, stream 316 synchronization), and the like. In one embodiment, engine 320 can be a distributed computing engine, networked computing engine, and the like. In another embodiment, engine 320 can be a functionality of a companion application able to present additional content of an event.

Feed analyzer 322 can be a hardware/software entity for processing feed 352 from one or more cameras 350. Analyzer 322 functionality can include, but is not limited to, feature registration, camera pose estimation, photometric extraction, photogrammetry, and the like. In one instance, analyzer 322 can determine feed 352 format, feed 352 characteristics, and the like.

Virtual camera manager 324 can be a hardware/software element for handling virtual camera 312. Manager 324 functionality can include, but is not limited to, camera 312 positioning, view 314 determination, and the like. In one embodiment, manager 324 can be a functionality of a client side application, permitting the configuration of a virtual camera 312. In the embodiment, virtual camera 312 configuration can include, but is not limited to, location, orientation, field of view, focal length, aperture, and the like. It should be appreciated that virtual camera 312 configuration can be automatically determined utilizing historic settings and/or user preferences.

Stream generator 326 can be a hardware/software entity for constructing a real-time virtual stream 316. Generator 326 functionality can include, but is not limited to, frame generation, frame synchronization, audio synchronization, and the like. In one embodiment, a virtual camera mapping 332 can be utilized to associate a stream 316 with a virtual camera 312 and a computing device. It should be appreciated that mapping 332 can be automatically generated by generator 326.

Settings 328 can be one or more rules for establishing the behavior of system 300, server 310, and/or engine 320. Settings 328 can include, but is not limited to, feed analyzer 322 options, virtual camera manager 324 settings, stream generator 326 options, and the like. In one instance, settings 328 can be manually and/or automatically established. In the embodiment, settings 328 can be heuristically established based on historic settings. Settings 328 can be persisted within data store 330, computing device 360, and the like.

Virtual camera 312 can be a digital representation of a real world camera lacking video feed. Camera 312 can include a view 314 which can conform to traditional view parameters such as field of view, perspective, and the like. Camera 312 can be associated with a stream 316 which can be presented within view 314. In one instance, view 314 parameters can be utilized to tailor stream 316. For example, the aspect ratio of view 314 can be used to create a stream 316 with a corresponding aspect ratio. It should be appreciated that camera 312 can be associated traditional camera functionality including, but not limited to, pan, zoom, change focus, fade, and the like.

Volumetric model 318 can be a digital representation of a physical environment (e.g., environment 101). In one instance, model 318 can be generated from video feed 352. In one embodiment, model 318 can be a point cloud data set which can correspond to one or more time indicies associated with an event. In one configuration of the embodiment, model 318 can be a sparse point cloud which can be populated over the duration of an event. In one instance, a camera 312 can be associated with a point of the point cloud within the model 318. In the instance, point cloud channel data can persist camera 312 parameters (e.g., view parameters, stream parameters), and the like.

Data store 330 can be a hardware/software component able to persist camera 312, settings 328, mapping 332, model 318, and the like. Data store 330 can be a Storage Area Network (SAN), Network Attached Storage (NAS), and the like. Data store 330 can conform to a relational database management system (RDBMS), object oriented database management system (OODBMS), and the like. Data store 330 can be communicatively linked to server 310 in one or more traditional and/or proprietary mechanisms. In one instance, data store 330 can be a component of Structured Query Language (SQL) complaint database.

Virtual camera mapping 332 can be one or more data sets for organizing virtual camera and stream associations. Mapping 332 can include, but is not limited to, a virtual camera identifier, a stream identifier, a device identifier, a timestamp, authentication data, and the like. For example, in entry 334, a virtual camera V_Camera A can be associated with a virtual stream Stream_A which can be conveyed to a device Device_A. It should be appreciated that mapping 332 can be manually and/or automatically maintained.

Camera 350 can be a video camera able to record video feed 352 of an event. Camera 350 can include, but is not limited to, an omni-directional video camera, professional video cameras, camcorders, webcams, mobile phone cameras, and the like. Camera 350 can capture and convey feed 352 to engine 310 and/or device 360. In one instance, camera 350 can include a camera array in which each camera records a portion of a video frame.

Computing device 360 can be a software/hardware element for collecting presenting video feed 352 and/or view 364. Device 360 can include, but is not limited to, input components (e.g., keyboard, camera), output components (e.g., display), interface 362, and the like. In one instance, interface 362 can be a Web based interface (e.g., rich internet application media player). Device 360 hardware can include but is not limited to, a processor, a non-volatile memory, a volatile memory, a bus, and the like. Computing device 360 can include but is not limited to, a desktop computer, a laptop computer, a mobile phone, a mobile computing device, a portable media player, a Personal Digital Assistant (PDA), and the like.

Network 380 can be an electrical and/or computer network connecting one or more system 300 components. Network 380 can include, but is not limited to, twisted pair cabling, optical fiber, coaxial cable, and the like. Network 380 can include any combination of wired and/or wireless components. Network 380 topologies can include, but is not limited to, bus, star, mesh, and the like. Network 380 types can include, but is not limited to, Local Area Network (LAN), Wide Area Network (WAN), Virtual Private Network (VPN) and the like.

Drawings presented herein are for illustrative purposes only and should not be construed to limit the invention in any regard. It should be appreciated that one or more components within system 300 can be optional components permitting that the disclosure functionality be retained. It should be understood that engine 320 components can be optional components providing that engine 320 functionality is maintained. It should be appreciated that one or more components of engine 320 can be combined and/or separated based on functionality, usage, and the like. System 300 can conform to a Service Oriented Architecture (SOA), Representational State Transfer (REST) architecture, and the like.

Figure 4:
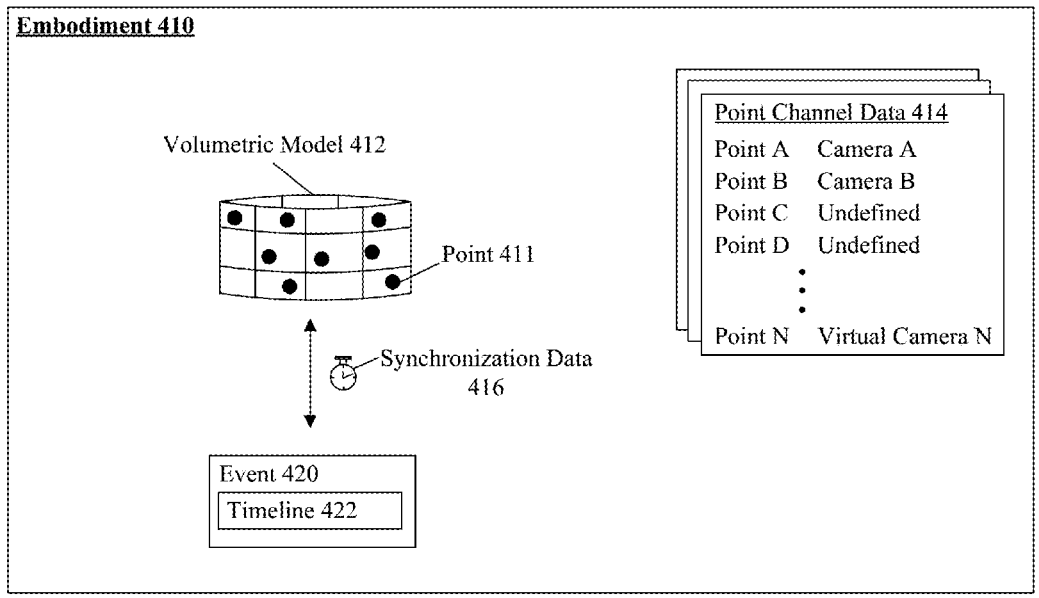
FIG. 4 is a schematic diagram illustrating an embodiment for leveraging a multitude of dynamic camera footage to enable a user positional virtual camera in accordance with an embodiment of the inventive arrangements disclosed herein.
Figure 4:
Figure 4:
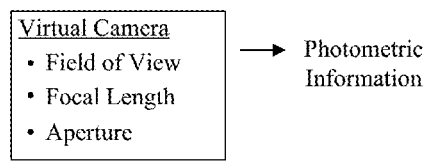

FIG. 4 is a schematic diagram illustrating an embodiment 410 for leveraging a multitude of dynamic camera footage to enable a user positional virtual camera in accordance with an embodiment of the inventive arrangements disclosed herein.

In embodiment 410, a volumetric model 412 having a time synchronized point channel data 414 can be utilized to enable the functionality described herein. The volumetric model 412 can include one or more points 411. In the embodiment, the model 412 can be synchronized to an event 420 timeline 422. In one configuration of the embodiment, each point 411 within the volumetric model 412 can include channel data for multiple time indicies of timeline 422. The synchronization data 416 can be manually and/or automatically obtained. In one instance, data 416 can be extracted from timing data associated with a video feed (e.g., broadcast feed).

It should be appreciated that event 420 can include one or more timelines 422. It should be understood that embodiment 410 is one contemplated configuration for enabling the functionality described herein. Other configurations are contemplated.

The flowchart and block diagrams in the FIGS. 1-4 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for virtual camera media comprising:
   identifying a virtual camera within a volumetric model of a real world environment during an event occurring within the real world environment, wherein the virtual camera is associated with at least one of a location and an orientation within the real world environment;
   presenting an interactive map of the real world environment within the interface, wherein the map has a one-to-one correspondence with the volumetric model; and
   receiving user input for the location of the virtual camera responsive to selection of a point within the map;
   constructing a virtual stream for the virtual camera, wherein the field of view of the stream comprises of video obtained from at least two cameras present within the real world environment and video not captured by a camera within the real world environment, wherein the video field point of view corresponds to at least one of the location and orientation of the virtual camera; and
   presenting the virtual stream of the virtual camera within an interface of computing device responsive to the constructing.

2. The method of claim 1, wherein the computing device is a companion device, wherein the device is configured to view video of the event during the event.

3. The method of claim 1, wherein the characteristics of the virtual camera comprises of at least one of a field of view, a focal length, and an aperture.

4. The method of claim 1, further comprising:
   generating the volumetric model, comprising a three dimensional point cloud, of a real world environment from a plurality of video feeds captured by the at least two cameras present within the real world environment, wherein the plurality of video feeds comprise video feeds taken at different times.

5. The method of claim 1, further comprising:
   synchronizing the virtual stream of the virtual camera to a timeline associated with the event.

6. The method of claim 1, wherein the virtual camera positioned by user selection from the real-world environment map facilitates creation of a virtual stream impossible to capture using a physical camera as objects in the real world environment travel through a position of the virtual camera, which would be impossible if a real world camera were used to generate an equivalent video stream.

7. The method of claim 1, wherein the virtual camera field of view is a three hundred and sixty degree view.

8. The method of claim 1, wherein the at least two cameras comprise a broadcast camera and a three hundred and sixty degree camera attached to a vehicle present within the real world environment.

9. The method of claim 1, wherein the virtual camera is associated with a user account, wherein the virtual camera is accessible responsive to a negotiable fund exchange.

10. A system for a virtual camera comprising:
    a virtual camera engine configured to present a virtual video stream associated with a virtual camera having a unique virtual camera ID, having unique device ID and having a uniquely identified stream ID for a video stream corresponding to the virtual camera, wherein the virtual camera is mapped to at least one of a location and orientation of a volumetric model defining a three dimensional point cloud mapped to geo-points of a real world environment, wherein the video stream is synchronized to a timeline of an event occurring within the real world environment; and
    a data store able to persist at least one of the model, the video stream, and the virtual camera metadata, wherein the metadata comprises of at least one of a field of view, a focal length, and an aperture.

11. The system of claim 10, further comprising:
    a feed analyzer configured to receive a plurality of video feeds of the event from a plurality of cameras within the real world environment;
    a virtual camera manager able to establish at least one characteristic associated with the virtual camera; and
    a stream generator configured to construct the virtual video stream associated with the virtual camera.

12. The system of claim 10, further comprising:
    the virtual camera engine presenting the virtual video stream within an interface of a computing device, wherein the computing device is a second screen device.

13. The system of claim 10, further comprising:
    the feed analyzer generating the volumetric model from a plurality of video feeds of the event from a plurality of cameras within the real world environment.

14. The system of claim 10, wherein at least one of the virtual camera location and orientation is user established.

15. The system of claim 10, wherein the virtual camera field of view is a three hundred and sixty degree view.

16. The system of claim 10, wherein the field of view of the virtual camera comprises video obtained from at least one camera and video from a bundle adjustment performed on a plurality of video feeds associated with a plurality of cameras within the real world environment.

17. The system of claim 10, wherein the volumetric model is a point cloud model, wherein at least one point is associated with a virtual video stream, wherein the point determines the virtual video stream point of view.

18. The system of claim 10, further comprising:
the virtual camera manager establishing at least one of a field of view, a focal length, and an aperture for the virtual camera.

19. A computer program product comprising a non-transitory computer readable storage medium having computer usable program code embodied therewith, the computer usable program code comprising:
computer usable program code stored in a non-transitory storage medium, if said computer usable program code is executed by a processor it is operable to identify a virtual camera within a volumetric model of a real world environment during a event occurring within the real world environment, wherein the virtual camera is associated with at least one of a location and an orientation within the real world environment, wherein the virtual camera positioned by user selection from the real-world environment map facilitates creation of a virtual stream impossible to capture using a physical camera as objects in the real world environment travel through a position of the virtual camera, which would be impossible if a real world camera were used to generate an equivalent video stream, wherein the computer usable program code defines a unique virtual camera ID, defines a unique device ID, and defines a uniquely identified stream ID for a virtual video stream corresponding to the virtual camera;
computer usable program code stored in the non-transitory storage medium, if said computer usable program code is executed by a processor it is operable to construct a virtual stream for the virtual camera, wherein the field of view of the stream comprises of video obtained from at least two cameras present within the real world environment and video not captured by a camera within the real world environment, wherein the video field point of view corresponds to at least one of the location and orientation of the virtual camera; and
computer usable program code stored in the non-transitory storage medium, if said computer usable program code is executed by a processor it is operable to present the virtual stream of the virtual camera within an interface of computing device responsive to the constructing.

20. The computer program product of claim 19, further comprising:
the computer program product determining the field of view of the virtual camera;
the computer program product establishing a portion of the field of view which can be filled in with at least a portion of the video feed from a camera within the real world environment; and
the computer program product generating a virtual stream for the remaining portion of the field of view.

\* \* \* \* \*